United States Patent [19]

Beasom

[11] Patent Number: 4,948,746
[45] Date of Patent: Aug. 14, 1990

[54] ISOLATED GATE MESFET AND METHOD OF MAKING AND TRIMMING

[75] Inventor: James D. Beasom, Melbourne Village, Fla.

[73] Assignee: Harris Corporation, Melbourne, Fla.

[21] Appl. No.: 164,342

[22] Filed: Mar. 4, 1988

[51] Int. Cl.$^5$ .................................... H01L 21/265
[52] U.S. Cl. ................................ 437/44; 437/39; 437/912; 437/29; 357/22
[58] Field of Search .................... 437/44, 45, 27, 29, 437/39, 912, 187; 357/22 I, 22 F, 15

[56] References Cited

U.S. PATENT DOCUMENTS

| | | | |
|---|---|---|---|
| 3,891,468 | 6/1975 | Ito et al. | 437/931 |
| 3,902,926 | 9/1975 | Perloff et al. | 437/931 |
| 4,013,483 | 3/1977 | Nuzillat et al. | 437/178 |
| 4,108,686 | 8/1978 | Jacobus, Jr. | 437/44 |
| 4,373,253 | 2/1983 | Khadder et al. | 357/22 F |
| 4,456,918 | 6/1984 | Beasom . | |
| 4,495,694 | 1/1985 | Beasom . | |
| 4,519,127 | 5/1985 | Arai | 357/22 I |
| 4,551,909 | 11/1985 | Cogan et al. | 437/29 |
| 4,596,068 | 6/1986 | Peters, Jr. | 437/45 |
| 4,606,781 | 8/1986 | Vyne . | |
| 4,792,531 | 12/1988 | Kakihana | 357/22 |

Primary Examiner—Brian E. Hearn
Assistant Examiner—Trung Dang
Attorney, Agent, or Firm—Barnes & Thornburg

[57] ABSTRACT

A MESFET device is provided wherein the top Schottky gate is electrically isolated from the bottom gate. Methods as described for forming channels self aligned to Schottky top gates and complementary junction field effect transistors. A method is also described for adjusting or trimming the voltage to current characteristics of a MESFET by applying current pulses to the gate and through the channel to create conductive regions between the top and bottom gate. Dual segment gates or sources or drains may be provided to reduce the trimming current and appropriate steering circuity also provided. This technique may be used to adjust individual MESFETs, as well as current followers, differential amplifiers and other circuits which would be designed to include MESFETs.

10 Claims, 4 Drawing Sheets

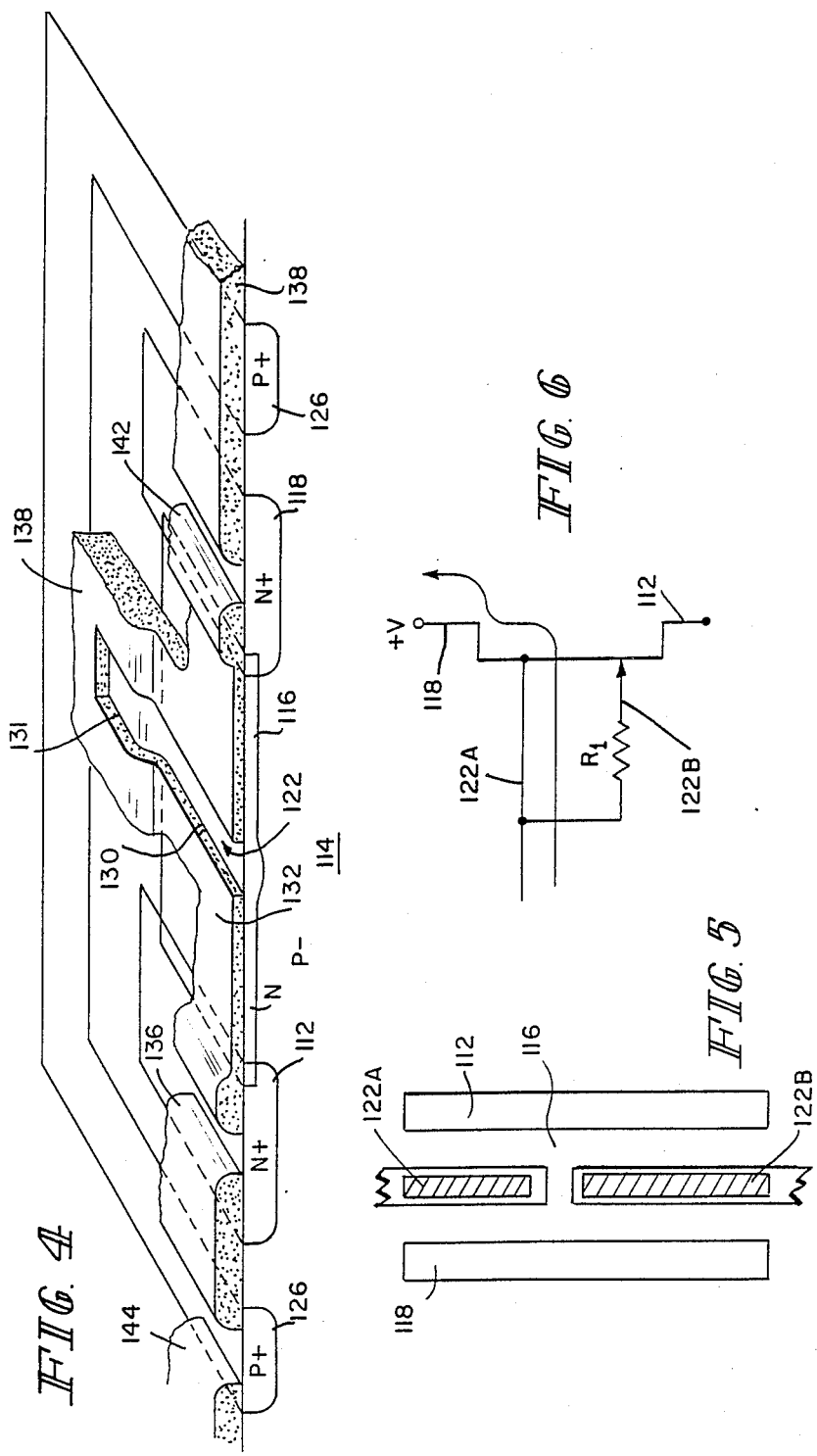

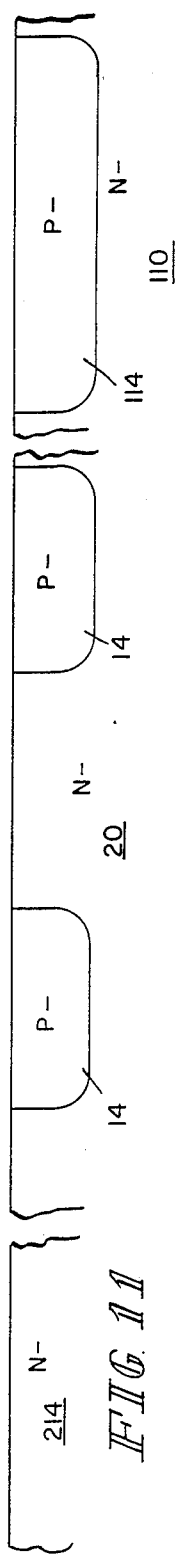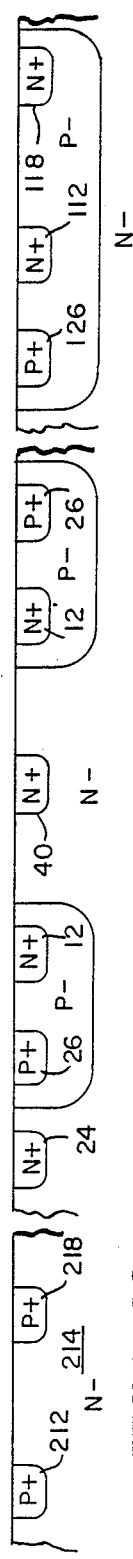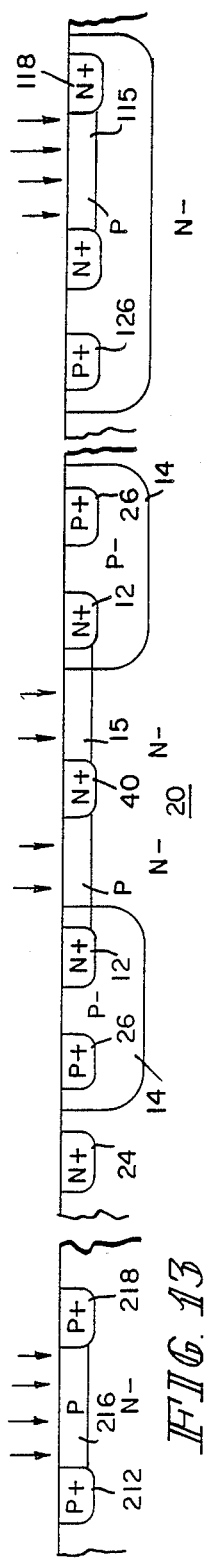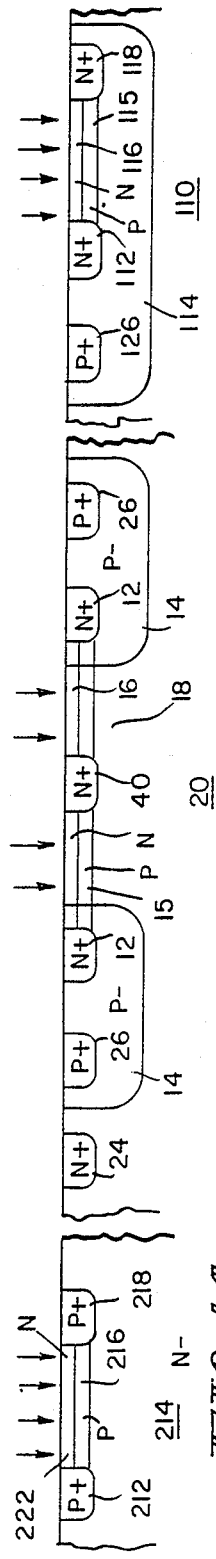

ISOLATED GATE MESFET AND METHOD OF MAKING AND TRIMMING

BACKGROUND AND SUMMARY OF THE INVENTION

The present invention relates generally to metal Schottky junction field effect transistors (MESFET) and more specifically to an isolated top gate MESFET and a method of making and trimming or altering its voltage characteristics.

MESFETs are junction field effect transistors in which at least one gate is formed by use of a Schottky barrier diode rather than by an PN junction diode. The performance of such devices can be improved when they are built such that the two gates are isolated from one another. This is particularly valuable in integrated circuit applications where one of the gates only weakly modulates the channel and has significant junction leakage and/or capacitance associated therewith. The weak, parasitic loaded gate may be connected to a non-sensitive circuit node, often the source, while the other gate is used as a device control gate thereby reducing the parasitics on the control gate.

Another advantage afforded by an isolated gate structure is that several devices can be built in a common bottom gate isolated island rather than in separate isolated islands. This saves die area and improves match of matched pairs by allowing the members of the pair to be closer to one another.

Isolated gate devices can also be used as four terminal devices in which the second gate is the fourth terminal. Such devices permit novel circuit implementations not possible with a three terminal device. An example is use of the second gate to apply an automatic gain control signal to a field effect transistor being used as an amplifier device.

Several prior art methods which form isolated top gate devices are known. One uses an insulator or semi-insulating support region under the channel to eliminate the second junction thereby transforming the bottom gate into an MOS gate. Another method uses a closed geometry top gate in which the top gate encloses at least one of the source and drain contact regions. The enclosed region or regions is then connected by a second level of interconnect. These methods are difficult and expensive to produce, thus there is a need for improved methods.

For PN junction field effect transistors having thin channel regions and top gate ohmic contact regions, special processing must be produced to provide an appropriate top gate on the contact region isolation as illustrated in U.S. Pat. No. 4,456,918 and 4,495,694 to Beasom.

In MESFETs having a rectangular Schottky barrier diode top gate on the channel between two non-concentric source and drain regions, the designer must terminate the width of the top of the Schottky metal spaced from the edge of the channel in order to produce an isolated top gate. This separation is determined by the accuracy of forming the necessary apertures in the oxide such that it does not extend outside of the channel. The separation prevents the field effect transistor from being turned completely off and creates a parasitic field effect transistor having only a bottom gate which is in parallel with the main field effect transistor. Thus, although it creates an isolated top gate, it also produces a transistor which may not be applicable for all applications.

Prior art junction field effect transistors similar to the structure of FIG. 4 have not been designed for high voltage applications. The breakdown of the device is limited to the top gate to channel breakdown voltage which is within the 60 volt range. Thus there is a need for a design of a junction field effect transistor and more specifically a Schottky top gate junction field effect transistor which is capable of operating at higher voltages.

It is often desirable to adjust the characteristics of individual devices with respect to its own characteristics, or as compared to that of another device within the circuit. For example, operational amplifiers are typically designed with a differential amplifier for the input stage. The balance of the differential amplifier is dependent on component match. Processing variables prevent exact match from occurring. This mismatch appears as offset voltage and/or offset current. In some applications this offset voltage cannot be tolerated and must be adjusted or corrected. There are three basic prior art approaches, i.e., (1) offset adjustment by external potentiometer;
(2) automatic offset correction by additional circuitry; and
(3) offset adjustment by laser trimming of thin film resistors.

The external potentiometer approach uses a potentiometer external to the IC package to effect offset adjust. This approach has the disadvantage of requiring an additional component large in comparison to the IC package, thereby requiring extra board space and expense. The "automatic correction circuit" approach requires extensive additional circuitry which increases the chip area and overall cost. The laser trimming approach requires capital equipment investment by the manufacturer. Also, the laser trimming must be performed prior to packaging.

One solution to these problems, as provided in U.S. Pat. No. 4,210,875 to Beasom, is to provide a junction field effect transistor having a plurality of parallel drain segments connected to a common drain terminal by fusible elements. By reversing biasing of the gate with respect to the reference terminal, a current flows through the fuse to disconnect the appropriate segment. This structure requires extra processing for the fuse, as well as only providing a digital or fixed number of adjustments. It does not provide an infinite number or analog style of adjustment. Thus, there exists a need for more finely tunable offset adjustment.

A further method known for adjusting the effective resistance of a resistor is to apply pulses to the resistor and therefore effectively trim by migration of the aluminum contact material into the resistive material between a plurality of special surface contacts along the length of the resistor thereby reducing its cross-sectional area. This is described in U.S. Pat. No. 4,606,781.

Therefore, it is an object of the present invention to provide a metal Schottky junction field effect transistor (MESFET) having an isolated top and bottom gate.

Another object of the present invention is to provide a MESFET having extended breakdown and improved output resistance.

A further object of the present invention is to provide an operational amplifier having an adjustable offset voltage capability wherein the adjustment is accomplished by applying voltages to external leads.

A still further object of the invention is to provide an operational amplifier with offset voltage adjustment capability requiring no special steps of manufacture or additional chip area.

A still even further object of the invention is to provide an operational amplifier wherein the offset voltage may be adjusted after packaging.

A still even further object of the present invention is to provide a method having minimum steps for forming complementary junction field effect transistors.

A still even further object of the present invention is to provide a junction field effect transistor which is capable of operating at higher voltages.

These and other objects are attained by forming a junction field effect transistor having a Schottky contact top gate which is isolated from the bottom gate. In one embodiment, the bottom gate region is formed as an annulus in the drain region, the source region is formed as an annulus in the bottom gate region and the top gate is formed as an annulus. Preferably, the top gate is concentrically interior the annular source region and a bottom gate contact is an annulus concentrically exterior to the source region. Drain contact is made exterior the annular bottom region. The low impurity concentration of the bottom gate and drain raise the breakdown voltage of the transistor.

A second drain region of a higher impurity concentration than the drain region is spaced from the interior of the aperture of the annular bottom gate. The second drain region reduces the on-resistance and when forming complementing junction field effect transistors, connects the channel to the drain.

The interior aperture of the annular bottom gate region may be formed sufficiently small such that a second junction field effect transistor is formed between the channel region and the drain region and controlled by the bottom gate region. This second junction field effect transistor has a high breakdown voltage and is in series with the first junction field effect transistor so as to extend the breakdown of the total device and improve its output resistance.

The top gate includes a field portion extending along the length of the channel and separated from the channel by an insulator of sufficient thickness so as to deplete the underlying channel region before the Schottky gate breakdown voltage is reached. This further raises the breakdown voltages of the transistor.

In a second embodiment, the source, drain and channel regions are formed as rectangular regions. The source, drain and bottom gate regions are covered by a field oxide except at the contact apertures and the channel region is covered by a thin insulator having a thickness less than the field insulator. As in the previous embodiment, the top gate region includes a portion extending substantially across the length of the channel region and is separated therefrom by the thin insulator to perform the same depletion function. In this embodiment the top gate may extend the entire width of the channel region and onto the field insulator such that the field effect transistor may be completely controlled or turned totally off. To assure that the Schottky top gate will completely control the width of the channel while maintaining isolation from the bottom gate, the top gate contact aperture is formed in the thin oxide and the field oxide prior to the formation of the channel region. Thus, the channel is self-aligned to the gate aperture. This assures that it is totally isolated from the bottom gate as well as completely controlling the resulting channel. In the alternative, it may stop short of the field oxide.

The voltage characteristics of a junction field effect transistor may be modified by forming the top gate as a Schottky gate and applying a plurality of current pulses through the top gate to the channel sufficiently to create electrically conductive areas between the top and bottom gates through the channel to reduce the effective width of the channel. The amount of channel width reduction is a function of the amplitude of the pulses. This provides an analog versus a digital trim or adjustment. The pulses are applied by biasing the top gate with respect to the source or drain region such that current flows from the gate through to the source or drain region in a direction opposite the normal current flow through the source or drain. This allows programming of the device from its external terminals.

To reduce the amount of programming current, the gate may be formed as two electrically parallel segments wherein the smaller of the two segments is used as the programming gate. A steering element, for example a resistor, is placed in series with the larger gate segment so that the current pulse as applied to the common input gate terminal is steered to the smaller gate segment. Alternatively, the source or drain, preferably the drain, is formed as two parallel segments. Programming is performed by providing a steering element to steer the current from a common gate terminal through the smaller drain segment. The steering element device would be a diode connected in parallel series with the larger drain segment so as to allow flow in the normal operational versus the adjusting direction.

The same principle may be used to adjust the voltage characteristics of a voltage following circuit which includes a pair of serially connected Schottky top gate junction field effect transistors. The steering circuit is provided such that the input terminal may be selectively biased with respect to a first or a second output terminal to provide current pulses to one of the two series connected transistors to adjust the voltage characteristic of that transistor from its gate through its channel.

The same principle may also be applied to differential amplifiers to adjust the offset. Steering devices are provided such that the series resistance of the differential amplifier is bypassed during program with the reversal of direction of current flow than that of the normal operation when the gate is biased relative to the common reference terminal.

Thus, it can be seen that with little or no modification to the circuits other than the steering element, the devices may be programmed using externally available terminals and thus, the process can be done at the final stage of manufacture, after packaging.

A method of forming the previously described MESFETs with a complementary PN junction field effect transistor is provided using only the steps required to form the PN junction field effect transistor. After the processing steps which form the source, drain and lower gate regions using common process steps, the two impurity introducing steps to form the channel and the top gate of the PN junction field effect transistor are performed. The first of these, the introduction of impurities to form the channel region connecting the source and drain in the PN junction field effect transistor, also forms an enhanced bottom gate region for the Schottky top gate junction field effect transistors. The next step which forms the top gate of the PN junction field effect transistor in the just-formed channel region, also forms the channel region of the complementary Schottky top gate junction field effect transistor. Thus, the steps used to form the PN junction field effect transistors, can also be used to form the Schottky top gate junction field effect transistors.

Other objects, advantages and novel features of the present invention will become apparent from the following detailed description of the invention when considered in conjunction with the accompanying drawings

BRIEF DESCRIPTION OF THE DRAWINGS

FIG. 4 is a cross-sectional perspective of another embodiment of an isolated top gate Schottky junction field effect transistor according to the principles of the present invention.

FIG. 5 is a partial plan view showing a segmented gate portion for the transistor of FIG. 4.

FIG. 6 is a schematic view of a steering circuit for the segmented gate of FIG. 5.

FIGS. 11–14 are cross-sectional views of a wafer at various stages of fabrication of complementary junction field effect transistors according to the principles of the present invention.

DETAILED DESCRIPTION OF THE DRAWINGS

Figure 1:
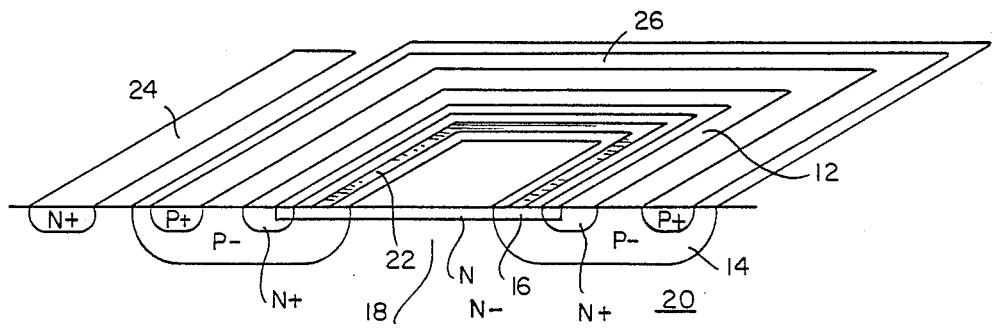
FIG. 1 is a cross-sectional perspective of an isolated top Schottky gate field effect transistor without insulator and contacts.

One improved isolated top gate structure is illustrated in FIG. 1 which shows an N channel MESFET. The N+ source region 12 is formed in an annular P bottom gate region 14. An N type channel 16 extends from the source region 12 across the bottom gate region 14 to at least overlap the adjacent edge of the N region 18 of drain 20 enclosed by the P region 14. A Schottky gate 22 is formed over the channel 16 between the source 12 and the enclosed N surface region 18. The Schottky gate 22 is a closed geometry which encircles the aperture in the bottom gate region 14 and forms the Schottky top gate 22. An annular bottom gate P+ contact region 26 is provided.

Channel current flows from a drain contact 24 through the N− region 20 beneath the P− bottom gate region 14, up into the N surface region 18 enclosed by the P− aperture into the overlapping N channel 16 through the channel 16 to the N+ source 12.

For the two gates to be isolated, the metallization used for the Schottky barrier diode must not penetrate through the channel 16. Two percent silicon doped aluminum can be used for this purpose and also to form all interconnect in the same process steps. Alternatives which might be used to form the Schottky include W, PtSi, WSi, etc.

One feature of the structure of FIG. 1 is that when the aperture in the annular P− bottom gate 14 is properly sized, a vertical NJFET is formed having the P− region 14 as the gate, the MESFET N channel 16 as the source and the N− region 20 beneath P− region 14 as drain. This device is in series with the MESFET and has high breakdown voltage. Thus, it can be used to cascade the MESFET to extent its breakdown and improve its output resistance.

Figure 2:
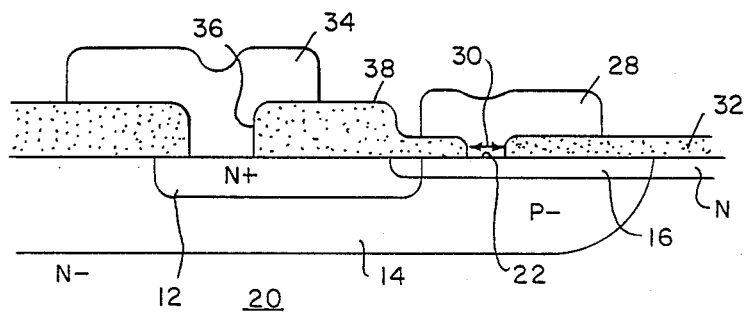
FIG. 2 is a cross-sectional view of a portion of FIG. 1 with the insulator and contacts.

Another method to improve breakdown voltage is illustrated in FIG. 2 which shows an enlarged part of the device of FIG. 1 with the contact/interconnect and surface insulator or oxide in place. The top gate contact 28 is a metal which extends through a narrow opening 32 in thin oxide layer 32 to form the Schottky gate 22 with the channel 16. The top gate interconnect 28 extends laterally across the length of the channel region 16 which extends from the inner edge of source 12 to the inner edge of bottom gate 14 and into the enclosed N− region 18 of the drain.

The charge of channel 16 and thickness of thin oxide 32 are chosen such that the channel charge is totally depleted by the combined influence of the deep depletion from the overlying gate conductor 28 and the reverse biased channel to bottom gate junction before the Schottky gate breakdown voltage is reached. When this happens, the Schottky junction is shielded from further drain voltage and the drain breakdown is limited by the P− bottom gate to N− drain junction breakdown. This limit is substantially greater than the breakdown limit of the structure of FIG. 4, which is limited by the breakdown of the top gate to channel breakdown.

Figure 3:
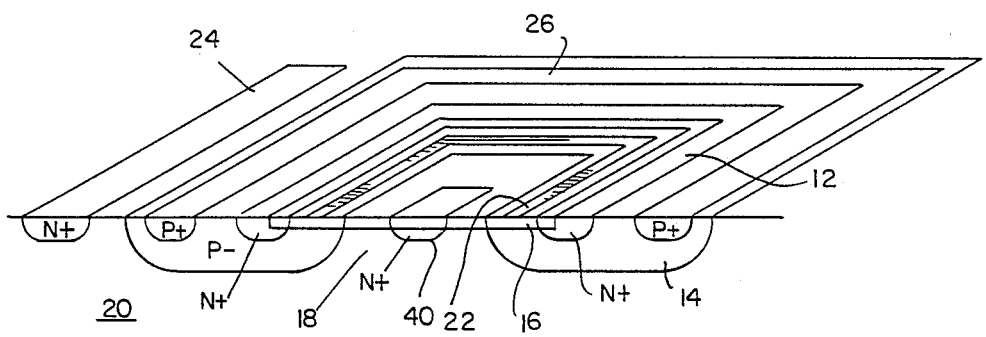
FIG. 3 is a cross-sectional perspective of a junction field effect transistor with lower on-resistance.

Another useful modification to the FIG. 1 geometry is achieved by inserting an N region 40 into the N− region 18 within the aperture in the P− bottom gate 14 as shown in FIG. 3. The N+ region has a higher impurity concentration than the N− region 18 and thus reduces the channel resistance of that part of the MESFET, thus providing lower on resistance. It also provides a lower resistance conducting path from an N channel region through an underlying P region to the N− drain as will be discussed with respect to the method of FIGS. 11–14.

A different structure which can be used to achieve an isolated top gate is illustrated in FIG. 4. Those elements having the same function as those of FIGS. 1 and 2 have the same first two digits. The device is formed in a P− region bottom gate 114 which can be a front or back diffused P collector or a CMOS P well. N+ source and drain regions 112, 118 and P+ bottom gate contact region 126 are formed in the P− region 114. A region of thin oxide 132 is formed between and overlapping the source and drain regions 112, 118 to define the channel area.

An aperture 130 which defines the Schottky top gate 122 is formed which bisects the thin oxide 132 and overlaps the thicker field oxide 138 at 131. This aperture 131 need not penetrate the thicker field oxide 138 and preferably does not. All device contact apertures 136, 142, 144 in the field oxide 138 are preferably opened at the same process step which would include the step for forming the opening for the formation of the thin oxide 132 and the subsequent step for forming the aperture 131 for the gate metal before channel formation.

The channel 116 is formed by an N type implant which penetrates the thin oxide 132 but is masked by the thicker field oxide 138. The concentration of impurities in the bottom gate 114 is an inverse function of the thickness of the oxide 132 and 138. The concentration would decrease from the maximum contact though aperture 130, to minimum or none under field oxide 138. A channel 116 is formed under thin oxide 132 with diminishing impurity concentrations at the oxide transition between apertures 130 and 131. The implant is done after the contact aperture patterning step so that the channel is self-aligned to the Schottky metal gate aperture. Thus, the gate extends to the ends of the gate aperture 130 where it extends up onto the field oxide at 131 and controls the complete width of the channel while maintaining isolation with respect to the bottom gate 114. The implant is activated preferably in a non-oxidizing ambient so that the apertures remain clear.

Next, the Schottky forming material, which might also be the device interconnect, is deposited after a brief oxide etch to insure clean apertures. After Schottky formation, device interconnects are formed if they are of a different materials than the SchottkY forming material. The interconnect can be extended over the field oxide to overlap the P+ gate contact diffusion 126 to act as a field plate over the intervening P− region 114.

In this embodiment, the source, drain, channel and top gate are formed as rectangular regions in the surface of the bottom gate 114. Only the bottom gate contact region 126 is formed as an annulus.

This method of formation yields a channel 116 which is self-aligned to the Schottky gate 122 at the ends of the channel. Consequently, the Schottky gate 122 controls the entire width of the channel yet is isolated from the P− gate 114 everywhere by the channel 116 or thin oxide 132. The Schottky gate 122 can turn the device completely off as a result of this feature.

Some applications do not require the field effect transistor to be turned completely off. Devices used as amplifiers or differential pairs are examples. A simpler version of the FIG. 4 device can be used to meet these requirements. The device is similar to that of FIG. 4 with the difference being that the Schottky aperture 130 extends close to the transition from thin oxide 132 to field oxide 138, but does not quite reach it.

The short region of the channel 132 not crossed by the aperture is a bottom gate only parasitic field effect transistor which is in parallel with the main field effect transistor. The current through this region will be proportional to its width while that of the main field effect transistor is proportional to the width of the Schottky aperture 130. The ratio of the main field effect transistor to parasitic field effect transistor widths will be made large so that only a small fraction of total current flows in the parasitic field effect transistor.

In this version of the device, the channel 116 may be formed before the contact apertures are patterned as well as after. This provides added process design flexibility and eliminates the need for a thin oxide region to define the channel. Although the channel 116 must still be defined by some process step, the final oxide over it need not be thin.

The breakdown voltage of the FIG. 4 type devices can be increased by using the extended gate conductor over channel method illustrated in FIG. 2 for the FIG. 1 type device. FIG. 1 type devices have been made with $V_p$ of approximately 1.3 volts and BVdss of approximately 155 volts, and FIG. 4 type devices with $V_p$ of 5 volts and BVdss of approximately 45 volts.

Despite strict manufacturing controls, the voltage to current characteristics of the field effect transistor is not always as accurate as desired. When operated in the saturated region, the input voltage of a field effect transistor is related to its current, by the expression:

$$V_{gs} = -\left(\frac{I_d}{\frac{W}{L}K'}\right)^{\frac{1}{2}} + V_p$$

where $I_d$=drain current; $V_{gs}$=the input (gate to source) voltage; W/L=channel width to channel length ratio, $K'$ is a constant which is independent of device topography; $V_p$=pinch off voltage of the device. For a device with several drain or gate segments, the W/L of the entire device equals the sum of the W/Ls of each of its drain or gate segments, if they are parallel conductive paths.

Thus, the voltage to current relationship can be increased by diminishing the width W of the channel. A MESFET offers a unique structure which is capable of having its voltage characteristics adjusted with no additional structure. For example, an N channel MESFET having a top gate metal of pure aluminum as the Schottky contact forming a contact with a thin low impurity N channel will form conductive paths between the aluminum Schottky metal and the bottom gate through the thin N channel region by aluminum migration with appropriate biasing to produce an appropriate current. It has been found that the cross-sectional area of the conductive region extending between the Schottky contact and the bottom gate is a function of the peak amplitude of the plurality of current pulses. By short-circuiting portions of the channel, the effective width of the channel is reduced and therefore the voltage to current characteristics of the device are increased. Although the present method has been found to be operable using aluminum to silicon top gate Schottkys, it can be applied to other metal and semiconductor materials which form Schottky junctions. If the appropriate voltage to current characteristics are not attained, another series of pulses may be applied having a higher peak current to produce further width adjustment. Thus, the modification can be an analog function of the amplitude of the pulse versus a digital function which would be one of a plurality of finite adjustment steps, as shown in U.S. Pat. No. 4,210,875 to Beasom.

To program a MESFET, for example that of FIG. 3, the Schottky top gate 22 is biased positive with respect to the drain contact 24 so that the current pulses flow from the Schottky contact material 22 through the channel region 16 and through drain regions 18, 22 to drain contact 24. The migration of aluminum material is greater in the vertical versus horizontal direction and therefore, vertical conductive paths form between the Schottky contact 22 and the bottom gate region 14 through the channel region 16. For a channel region 16 of a depth of 1,500 Angstroms, conductive paths were found to form for a biasing differential between the Schottky top gate 22 and the drain contact 24 of about 1.2 volts which produce an adjusting current of 0.2 amperes.

Although the MESFET of FIG. 3 has an isolated top gate, the principle is also operable with MESFET have non-isolated top gates. The non-isolated gates application provide the added feature that the bottom gate is also biased which has been found to aid the trimming or adjustment process. Thus, in an isolated top gate device as shown in FIG. 3, both the top gate 22 and the bottom gate 14 should be biased. It should be noted that this is the reverse bias condition of the normally operable device wherein the gate is biased negative with respect to the drain contact for N channel devices.

A particular advantage of the method is that it can be performed after packaging of an IC which includes MESFETs. Thus, the trim is achieved after all packaging induced circuit parameter shifts have occurred. A further advantage is that no special process steps are required to provide the trim capability.

A potential limitation on this trimming method is the magnitude of current required to trim a large area device. Trim current can be reduced by segmenting one of the device terminals (gate, source or drain) into at least two parts and providing current steering circuitry which directs at least most of the trim current to the segment to be adjusted. The adjusted segment can be made much smaller than the non-adjusted segment, thus achieving the desired reduction in trim current. In normal operation of the circuit, the adjusted segments are operated in parallel so that the device acts as a device with the parallel combination of the segments such that the total W/L is the sum of the segment W/Ls.

FIG. 5 shows a segmented gate having a smaller gate portion 122a separated from a larger top gate portion 122b over the channel region the source 112 and the drain 118. As illustrated in the schematic of FIG. 6, the two gate segments 122a and 122b are connected in parallel to a common gate input terminal. A resistor R1 is placed in series with the second top gate segment 122b to steer the trimming current to the smaller gate segment 122a. The direction of the trimming current is shown. It has been found that a value of R1 within the order of 10 ohms was sufficient to steer 100 milliamperes of trim current. Thus, the resistor R1 does not disturb the normal operation of the transistor.

Figure 7:
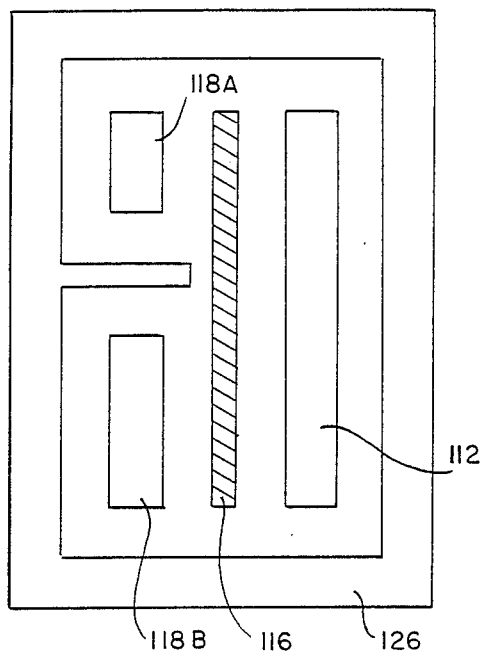
FIG. 7 is a plan view of a segmented drain for a transistor according to FIG. 4.
Figure 8:
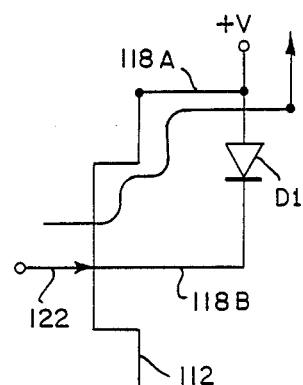
FIG. 8 is a schematic of a steering circuit for the segmenting diode of FIG. 7.

FIG. 7 illustrates a MESFET wherein the drain is divided into a first segment 118a smaller than a second drain segment 118b. The two drain segments 118a and 118b are separated from the single source 112 by a single gate 116. As shown in the schematic of FIG. 8, the two drain segments 118a and 118b are connected in parallel to a common drain terminal. A diode D1 is placed in series with the larger drain segment 118b to steer the trim current through the smaller drain segment 118a by blocking the flow from the gate 122 to the common drain terminal through the second drain segment 118b. During normal operation, the diode D1 is forward biased and has a forward voltage drop of 0.65 volts. Thus, it does not adversely affect the normal operation of the device.

Figure 9:
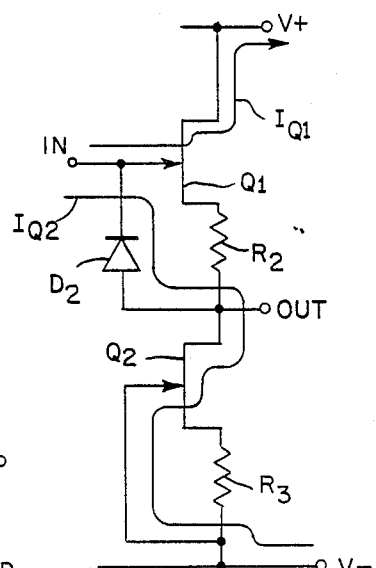
FIG. 9 is a schematic of a voltage follower including a steering circuit according to the principles of the present invention.
Figure 10:
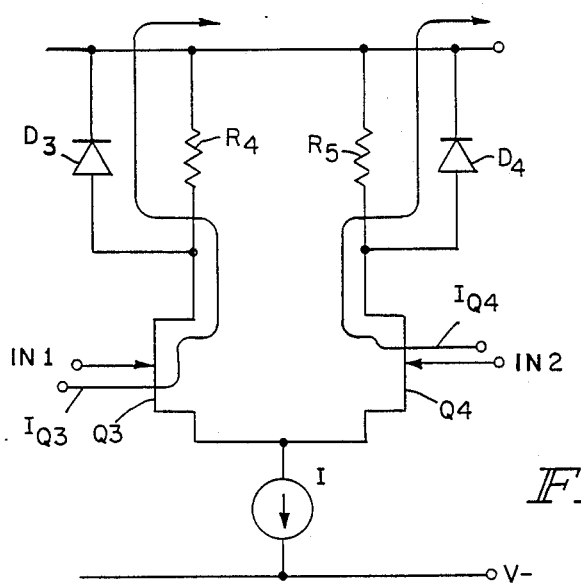
FIG. 10 is a schematic of a differential amplifier including a steering circuit according to the principles of the present invention.

It is desirable to perform the trim after assembly, as previously discussed It is also desirable to perform the trim without the use of any circuit nodes other than those used for normal circuit operation because this minimizes assembly cost and die area. Examples of circuit configurations which permit trimming of an input voltage follower and its current source as well as either side of a differential pair are shown in FIGS. 9 and 10 respectively. The paths of the trim current from one circuit connection through the device to be trimmed and out another circuit connection are shown.

The voltage follower of FIG. 9 includes a first MESFET Q1 having its source-drain path connected between a first reference terminal V+ and the output terminal and a series resistor R2. A second MESFET Q2 has its source-drain path connected between a second reference terminal V− and the output terminal and a series resistor R3. The top gate of Q1 is connected to the input terminal A steering diode D2 connects the output terminal or the gate drain path of Q2 to the input terminal. The gate of Q2 is connected to the second reference terminal V−. Q2 is the current source for the voltage follower Q1. Forward biasing the input terminal with respect to the first reference terminal V+ causes current to flow from the gate through the drain of Q1 to trim or diminish the width of the channel of Q1. Reverse biasing the input with respect to the second reference terminal V− causes a current to flow from V− through the gate and drain of Q2 and diode D2 to the input providing trimming or adjustment of the channel. The resistors R2 and R3 offer additional steering devices and prevent the adjustment current from flowing through the sources of the transistors Q1 and Q2.

A differential amplifier is illustrated in FIG. 10 as including input transistors Q3 and Q4 connected between a first reference terminal V+ and a common current source I to a second reference terminal V−. A parallel combination of resistor R4 and diode D3 are connected between the first reference terminal V+ and the drain of Q3. A parallel combination of resistor R5 and diode D4 are also connected between the first reference terminal V+ and the drain of transistor Q4. Both transistors Q3 and Q4 are MESFETs.

The offset voltage of a pair of MESFETs is the difference in their input voltages when operating at equal currents:

$$V_{off} = V_{gs3} - V_{gs4}$$
$$= -\left(\frac{I_d}{\frac{W_3}{L_3}K_3'}\right)^{\frac{1}{2}} + V_{p1} +$$
$$\left(\frac{I_d}{\frac{W_4}{L_4}K_4'}\right)^{\frac{1}{2}} - V_{p2}$$

With common current provided to both, the inputs at are the top gates of Q3 and Q4; the offset voltage is measured. The device with the smaller $V_{gs}$ is trimmed to decrease its width and thereby increase its $V_{gs}$. This adjustment is produced by biasing the gate of the selected transistor positive with respect to the first reference terminal V+. This forward biases its respective diode and causes a current to flow from the gate through its drain and diode to the first reference terminal V+. If the offset is not reduced sufficiently, a series of current pulses of increasing amplitude are applied until the desired offset reduction is achieved.

The MESFETs of FIGS. 1–4 may be formed using no additional steps than those used to form a complementary PN junction field effect transistor. Thus, the steps used to form a P channel PN junction field effect transistor can be used to form the Schottky top gate N channel field effect transistors of FIGS. 1–4. As illustrated in FIG. 11, a common N type substrate is subjected to a P impurity introduction to form the annular P− bottom gate 14 in the N− drain region 20 and a P− bottom gate 114 in the N− substrate 110. This process step can be common with the collector diffusion for PNP bipolar transistors and may be performed as front or back diffused regions.

Next, P impurities are introduced to form P+ source and drain regions 212 and 218 in the N− channel region 214, an annular P+ bottom gate contact region 26 in the bottom gate 14 and a P+ contact region 126 to bottom gate 114. This is followed by an N type impurity introduction to form an annular N+ source region 12 in the bottom gate region 14, an N+ drain contact region 24 and 40 in the drain region 20, spaced N+ source and drain regions 112 and 118 in the bottom gate region 114 and an N+ bottom gate contact 226 in bottom gate 214. The N+ and P+ regions are formed by process step common with the emitter and contact regions of a bipolar transistor. The resulting structure is illustrated in FIG. 12.

The next step is introducing P type impurities to form the channel region 216 connecting the source and drain regions 212 and 218 of the PN junction field effect transistor. Simultaneously therewith, the P type impurities are introduced to form the enhanced bottom gate region 15 in the bottom gate region 14 and the drain region 18 as well as forming an enhanced bottom gate region 115 in the bottom gate region 114 extending between source and drain regions 112 and 118. These enhanced bottom gate regions 15 and 115 are not shown in FIGS. 1–3, but are considered an improvement over such structure, especially in back-diffused bottom gate regions 14 and 114, to provide a bottom boundary of a precise depth and concentration into which the N channel will be formed. This leads to improved control of the pinch off voltage and drain current. Preferably, the P impurity concentration is introduced by ion implantation. It should be noted that the depth of the P impurity concentration should be less than the depth of the N+ 40, since the N+ region 40 must contact the to be formed channel to the drain region 18, 20. The resulting structure is illustrated in FIG. 13.

N type impurities are then introduced by, for example, ion implantation, to form the top gate region 222 in the channel region 216 extending between the source and drain regions 212 and 218, channel region 16 in enhanced bottom gate region 15 and extending across the interior opening of annular source 12 and annular bottom gate 14, and a channel region 116 in enhanced bottom gate region 115 extending between source and drain regions 112 and 118. The resulting structure is illustrated in FIG. 14.

It should be noted that the masking steps including forming appropriate apertures in the field oxide and thin oxide have not been described with respect to the process of FIGS. 1–14, since they are well within the skill of the prior art. The critical sequence with respect to forming these apertures as well as forming the channel region 116 is discussed above with respect to the improved transistor of FIG. 4.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A method of making a metal Schottky junction field effect transistor comprising:
   selectively introducing impurities of a first conductivity type into a bottom gate region of a second conductivity type to form source and drain regions spaced in a surface of said bottom gate region;
   forming a first aperture, in a field insulative layer having a first thickness on said surface, to expose an area of said bottom gate region between said source and drain regions, said aperture having a length which is parallel to the direction of separation of said source and drain regions and a width orthogonal to said length;
   forming a thin insulative layer, having a thickness smaller than said first thickness, in said first aperture;
   forming a gate aperture in said field and thin insulative layers to expose a portion of said bottom gate and extending along said width of said first aperture;
   introducing impurities of said first conductivity type using said field insulative layer as a mask to form a channel region having a width and length in said surface of said bottom gate region connecting said source and drain region; and
   applying a metal gate in said gate aperture in contact with said channel region and isolated from said bottom gate region and of a material which forms a Schottky barrier diode with said channel region to control the total width of said channel region.

2. A method according to claim 1, wherein said gate aperture is formed through said thin insulative layer and not totally through said field insulative layer.

3. A method according to claim 1, including forming contact apertures to said source, drain and bottom gate regions simultaneously with forming said gate aperture.

4. A method according to claim 1, wherein introducing impurities to form said channel region includes ion implantation.

5. A method of forming complementary junction field effect transistors comprising:
   introducing impurities of a second conductivity type into a first bottom gate region of a first conductivity type to form first source and drain regions separated by said first bottom gate;
   introducing impurities of said first conductivity type into a second bottom gate region of a second conductivity type to form second source and drain regions separated by said second bottom gate;
   introducing impurities of said second conductivity type in said first and second bottom gate regions to form therein respectively, a first channel region and an enhanced bottom gate region connecting respectively, said first source and drain regions and said second source and drain regions;
   introducing impurities of said first conductivity type in said first channel region and said enhanced bottom gate region to form therein respectively, a first top gate region and a second channel region connecting respectively said first source and drain regions and said second source and drain regions; and
   applying a metal gate on a portion of said second channel region of a material which forms a Schottky barrier diode second top gate with said second channel region.

6. A method according to claim 5
   including introducing impurities of a second conductivity type into said second drain region to form said second bottom gate region; and
   wherein said introducing said impurities to form said second source and drain regions includes introducing impurities of said first conductivity type into said second bottom gate region to form said second source region which is separated from said second drain region by said second bottom gate region.

7. A method according to claim 6, wherein said second bottom gate region is formed as an annulus.

8. A method according to claim 7, wherein:
said second channel and enhanced bottom gate region is formed to extend across an interior aperture of said annular second bottom gate region; and
said introducing impurities of said first conductivity type to form said second source region are also introduced in said interior aperture of and spaced from said annular second bottom gate region to a depth extending through said to-be-formed enhanced bottom gate region.

9. A method according to claim 7, wherein said second source is formed in an annulus.

10. A method according to claim 5, wherein said introducing impurity to form said second source and drain regions forms second source and drain regions spaced in a surface of said second bottom gate region.

* * * * *